(12) United States Patent
Muramoto et al.

(10) Patent No.: US 6,198,140 B1
(45) Date of Patent: Mar. 6, 2001

(54) SEMICONDUCTOR DEVICE INCLUDING SEVERAL TRANSISTORS AND METHOD OF MANUFACTURING THE SAME

(75) Inventors: Hidetoshi Muramoto, Okazaki; Yoshihiko Isobe, Toyoake, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/391,449

(22) Filed: Sep. 8, 1999

(51) Int. Cl.[7] .......................... H01L 29/76; H01L 29/94; H01L 31/062; H01L 31/113; H01L 31/119

(52) U.S. Cl. .......................... 257/392; 257/403; 257/406; 257/500

(58) Field of Search ...................... 257/392, 401, 257/402, 403, 406, 408, 500; 438/199, 216, 217, 275, 289, 770

(56) References Cited

U.S. PATENT DOCUMENTS

| 4,389,294 | 6/1983 | Anantha et al. . | |
|---|---|---|---|
| 4,729,964 | 3/1988 | Natsuaki et al. . | |
| 4,740,480 | 4/1988 | Ooka . | |
| 4,980,303 | * 12/1990 | Yamauchi | 438/235 |
| 5,030,582 | * 7/1991 | Miyajima et al. | 438/231 |
| 5,610,092 | * 3/1997 | Tasaka | 438/275 |
| 5,847,432 | * 12/1998 | Nozaki | 257/369 |
| 5,861,347 | * 1/1999 | Maiti et al. | 438/787 |
| 5,989,962 | * 11/1999 | Holloway et al. | 438/275 |

FOREIGN PATENT DOCUMENTS

| 1-217961 | * 8/1989 | (JP) . |
| 8-111461 | 4/1996 | (JP) . |
| 8-293598 | 11/1996 | (JP) . |
| 2644776 | 5/1997 | (JP) . |
| 9-139382 | 5/1997 | (JP) . |

* cited by examiner

Primary Examiner—Olik Chaudhuri
Assistant Examiner—Hoai Pham
(74) Attorney, Agent, or Firm—Pillsbury Winthrop LLP

(57) ABSTRACT

In a semiconductor device including high-voltage, middle-voltage, and low voltage transistors having operating voltages different from one another, a gate length and a thickness of a gate oxide film are increased as the operating voltage is increased. Accordingly, in the high-voltage transistor, an electric field produced at a channel is relaxed. In the low-voltage transistor, a structure is made finer. A concentration of a well and an impurity amount implanted into a surface portion of a substrate are set to be identical with each other in all the transistors. Accordingly, the semiconductor device can be speedily manufactured at a high yield.

16 Claims, 7 Drawing Sheets

| VCCmax | N(cm⁻³) \ VCC | A 80 | B 30 | C 20 | D 15 | E 12 | F 10 | G 7 | H 6 | I 5 | J 4 | K 3.3 | L 3 | M 2.5 | N 2 | O 1.5 |
|---|---|---|---|---|---|---|---|---|---|---|---|---|---|---|---|---|
| | | | | | | | Lmin (μm) | | | | | | | | | |
| 80 | 3.6E+15 | 13.15 | 8.17 | 6.75 | 5.91 | 5.34 | 4.93 | 4.23 | 3.97 | 3.69 | 3.39 | 3.16 | 3.06 | 2.88 | 2.69 | 2.49 |
| 30 | 1.7E+16 | | 3.73 | 3.08 | 2.70 | 2.44 | 2.25 | 1.94 | 1.82 | 1.69 | 1.56 | 1.45 | 1.41 | 1.33 | 1.24 | 1.15 |
| 20 | 3.3E+16 | | | 2.23 | 1.95 | 1.77 | 1.63 | 1.40 | 1.32 | 1.23 | 1.13 | 1.05 | 1.02 | 0.96 | 0.90 | 0.83 |
| 15 | 5.3E+16 | | | | 1.55 | 1.41 | 1.30 | 1.12 | 1.05 | 0.98 | 0.90 | 0.84 | 0.81 | 0.77 | 0.72 | 0.66 |
| 12 | 7.5E+16 | | | | | 1.18 | 1.09 | 0.93 | 0.88 | 0.82 | 0.75 | 0.70 | 0.68 | 0.64 | 0.60 | 0.56 |
| 10 | 1.0E+17 | | | | | | 0.94 | 0.81 | 0.76 | 0.71 | 0.65 | 0.61 | 0.59 | 0.56 | 0.52 | 0.48 |
| 7 | 1.8E+17 | | | | | | | 0.61 | 0.57 | 0.53 | 0.49 | 0.46 | 0.44 | 0.42 | 0.39 | 0.36 |
| 6 | 2.3E+17 | | | | | | | | 0.51 | 0.47 | 0.43 | 0.41 | 0.39 | 0.37 | 0.35 | 0.32 |
| 5 | 3.0E+17 | | | | | | | | | 0.41 | 0.38 | 0.35 | 0.34 | 0.32 | 0.30 | 0.28 |
| 4 | 4.4E+17 | | | | | | | | | | 0.31 | 0.29 | 0.28 | 0.27 | 0.25 | 0.23 |
| 3.3 | 5.9E+17 | | | | | | | | | | | 0.25 | 0.24 | 0.23 | 0.22 | 0.20 |
| 3 | 6.9E+17 | | | | | | | | | | | | 0.23 | 0.21 | 0.20 | 0.19 |
| 2.5 | 9.2E+17 | | | | | | | | | | | | | 0.19 | 0.17 | 0.16 |
| 2 | 1.3E+18 | | | | | | | | | | | | | | 0.15 | 0.14 |
| 1.5 | 2.1E+18 | | | | | | | | | | | | | | | 0.11 |
| 1 | 4.0E+18 | | | | | | | | | | | | | | | |

FIG. 4

| Tr / VCC<br>LIFE-WARRANTY<br>MAX. ELECTRIC<br>FIELD (MV/cm) | A | B | C | D | E | F | G | H | I | J | K | L | M | N | O | P |
|---|---|---|---|---|---|---|---|---|---|---|---|---|---|---|---|---|
| | 80 | 30 | 20 | 15 | 12 | 10 | 7 | 6 | 5 | 4 | 3.3 | 3 | 2.5 | 2 | 1.5 | 1 |
| 1 | 800.0 | 300.0 | 200.0 | 150.0 | 120.0 | 100.0 | 70.0 | 60.0 | 50.0 | 40.0 | 33.0 | 30.0 | 25.0 | 20.0 | 15.0 | 10.0 |
| 2 | 400.0 | 150.0 | 100.0 | 75.0 | 60.0 | 50.0 | 35.0 | 30.0 | 25.0 | 20.0 | 16.5 | 15.0 | 12.5 | 10.0 | 7.5 | 5.0 |
| 3 | 266.7 | 100.0 | 66.7 | 50.0 | 40.0 | 33.3 | 23.3 | 20.0 | 16.7 | 13.3 | 11.0 | 10.0 | 8.3 | 6.7 | 5.0 | 3.3 |
| 4 | 200.0 | 75.0 | 50.0 | 37.5 | 30.0 | 25.0 | 17.5 | 15.0 | 12.5 | 10.0 | 8.3 | 7.5 | 6.3 | 5.0 | 3.8 | 2.5 |
| 5 | 160.0 | 60.0 | 40.0 | 30.0 | 24.0 | 20.0 | 14.0 | 12.0 | 10.0 | 8.0 | 6.6 | 6.0 | 5.0 | 4.0 | 3.0 | 2.0 |
| 6 | 133.3 | 50.0 | 33.3 | 25.0 | 20.0 | 16.7 | 11.7 | 10.0 | 8.3 | 6.7 | 5.5 | 5.0 | 4.2 | 3.3 | 2.5 | 1.7 |
| 7 | 114.3 | 42.9 | 28.6 | 21.4 | 17.1 | 14.3 | 10.0 | 8.6 | 7.1 | 5.7 | 4.7 | 4.3 | 3.6 | 2.9 | 2.1 | 1.4 |

(UNIT : nm)

SEMICONDUCTOR DEVICE INCLUDING SEVERAL TRANSISTORS AND METHOD OF MANUFACTURING THE SAME

CROSS REFERENCE TO RELATED APPLICATIONS

This application is based upon and claims the benefit of Japanese Patent Applications No. 10-270537 filed on Sep. 8, 1998, No. 11-216301 filed on Jul. 30, 1999, and No. 11-216323 filed on Jul. 30, 1999, the contents of which are incorporated herein by reference.

BACKGROUND OF THE INVENTION

1. Field of the Invention

This invention relates to a semiconductor device including several MOS transistors and a method of manufacturing the semiconductor device.

2. Description of the Related Arts

A fine structure is indispensable for a logical circuit transistor to improve an operating speed and to reduce its cost. Further, there is a tendency that a power supply voltage is decreased to decrease a consumption power. On the other hand, another type of transistor subjected to input and output voltages, i.e., the voltage applied across a source and a drain and the voltage applied to a gate, which are higher than those for the general logical circuit, is required for a sensor, an input-output interface of a power supply, for writing or erasing information in a nonvolatile memory such as a flash-memory, or the like. In this kind of transistor, characteristics such as a life of a gate oxide film, resistance with respect to hot carriers, and resistances of pn junction withstand voltage and isolation withstand voltage between elements are important rather than the operating speed.

When several kinds of transistors necessitating different operating voltages are mounted on a silicon substrate, conventionally, using a structure of one of the transistors as a basis, structures of the other kinds of transistors are determined. Usually, a standard transistor for a logical circuit, which is subjected to a low operating voltage and has a fine structure as described above, is selected as the basic transistor structure. Then, the other structures of the transistors necessitating high operating voltages are determined while securing transistor fine structures and considering the resistances described above. When this semiconductor device is manufactured, sources, drains, and the like are formed separately for the respective transistors based on the kinds of the transistors.

JP No. 2644776 discloses a method (first conventional example) for manufacturing a semiconductor device including a high-voltage transistor and a low-voltage transistor. In the method, when impurities are implanted into a lower side of an element isolation oxide film of a silicon wafer to form a channel stopper layer, an implantation amount of impurities is controlled so that it becomes small at the high-voltage transistor side. Accordingly, impurities are suppressed from being diffused into an element region, resulting in an improved pn junction withstand voltage of the high-voltage transistor.

JP-A-9-139382 proposes a method (second conventional example) for manufacturing a semiconductor device having a memory cell isolated by an element isolation oxide film with a narrow width, and a high withstand voltage transistor isolated by an element isolation oxide film with a wide width to form a peripheral circuit. That is, the semiconductor device has two element isolation oxide films having different thicknesses. In the method, two impurity implantation steps are performed for forming a channel stopper layer. One of the steps is shallow impurity implantation which is carried out so that impurities reach the bottom of the thin element isolation oxide film. The other of the steps is a deep impurity implantation which is carried out so that impurities reach the bottom of the thick element isolation oxide film.

Also, JP-A-8-111461 proposes a method (third conventional example) for manufacturing a semiconductor device having first and second transistor regions. In the method, a low-concentration impurity region as an electric field relaxation layer is formed to extend under a spacer in the first transistor region by obliquely rotating implantation or the like, while no low-concentration impurity region is formed in the second transistor region. Accordingly, the first transistor region can have a threshold voltage higher than that of the second transistor region without increasing a number of photo-lithography steps.

In a method (fourth conventional example) disclosed in JP-A-8-293598, an impurity implantation step for controlling threshold voltages of transistors is performed twice utilizing photo-lithography technique as first and second steps. The first step is for implanting impurities at a low impurity concentration into a first region of a region where a channel is to be formed in a silicon wafer. The second step is for implanting impurities at a high impurity concentration into a second region of the region. In a transistor region with a high threshold voltage, the area of the second region is increased, while in a transistor region with a low threshold voltage, the area of the first region is increased. Accordingly, even when more than two kinds of threshold voltages are required, it is sufficient to perform the first and second steps.

However, in the first and second conventional examples, it is necessary to perform ion implantation several times in accordance with the kinds of the transistors. The third and fourth conventional examples propose the methods which do not complicate the manufacturing process. However, the third conventional example has no flexibility because it produces only a slight difference between the two threshold voltages of the transistors. In the fourth conventional example, an unnecessary impurity layer is formed, and therefore, it is not always suitable for the impurity layers of the transistors.

Thus, in the conventional semiconductor device in which the impurity layers are arranged in the respective transistors necessitating different withstand voltages and the threshold voltages, profiles of impurity concentrations in the semiconductor substrate are complicated and the number of the manufacturing processes is increased. Further, in this case, because heat histories are complicated to make it difficult to provide desirable profiles. As a result, the characteristics of the transistors easily have large variations, and the wafer process cannot be rapidly performed with a high yield.

SUMMARY OF THE INVENTION

The present invention has been made in view of the above problem. An object of the present invention is to provide a semiconductor device which is manufactured by a wafer process speedily performed at a high yield while securing sufficient transistor resistances. Another object of the present invention is to provide a method of manufacturing the same.

A semiconductor device according to the present invention has first and second transistors, and a first operating voltage for operating the first transistor is larger than a second operating voltage for operating the second transistor. In the semiconductor device, a gate length of a first gate portion of the first transistor is longer than that of a second gate portion of the second transistor. A thickness of a first gate insulating film of the first transistor is thicker than that of a second gate insulating film of the second transistor. A well has an impurity concentration profile identical for the first and second transistors. Further, an impurity amount implanted into a surface portion of a first transistor region for controlling a threshold voltage of the first transistor is equal to that for controlling the second transistor. Otherwise, the first source and the first drain of the first transistor have impurity concentration profiles approximately identical with the second source and the second drain of the second transistor.

Thus, the larger the operating voltage of the transistor is, the longer the gate length is, and the thicker the thickness of the gate insulating film is. Accordingly, electric fields produced at a channel and the gate insulating film in the first transistor having a higher operating voltage are relaxed to improve resistances of the transistor. In the second transistor having a lower operating voltage, the fineness of the structure can be improved in accordance with the operating voltage.

Since the impurity concentration profile of the well is made single, a boundary portion needs not be formed in the well, resulting in fineness of the structure. The well is formed to satisfy the highest required resistance in all the transistors. The threshold voltages of the transistors are controlled by the impurity concentration of the well and the impurity amount implanted into the surface portion of the semiconductor substrate which are common to all the transistors, and the thicknesses of the gate insulating films which are controlled respectively for the transistors.

Since the impurity concentration profile and the impurity amount implanted into the surface portion of the semiconductor substrate are common to all the transistors, a heat history for forming the impurity regions becomes simple, resulting in a simplified manufacturing process and decreased variation of the transistor characteristics. Accordingly, the semiconductor device can be speedily manufactured at a high yield.

The well may have a surface region exposed from a surface of the semiconductor substrate and a junction region contacting one of the sources and the drains. In this case, the surface region has an impurity concentration lower than that of the junction region. Accordingly, the impurity amount implanted into the semiconductor substrate for controlling the threshold voltages can be widely controlled to increase flexibility for controlling the threshold voltages.

The well may have a high concentration region at a depth approximately corresponding to a bottom of an element insulating film. The high concentration region increases a threshold voltage at the bottom of the element isolation insulating film to provide a sufficient element isolation withstand voltage without providing any stopper layers. Further, the width of the element isolation insulating film can be narrowed. A preferable impurity concentration of the well is in a range of $1 \times 10^{16}$ [cm$^{-3}$] to $5 \times 10^{17}$ [cm$^{-3}$] inclusive.

The first and second gate portions are formed by a stepped insulating film formation step for forming a stepped insulating film on a surface of the semiconductor substrate, a conducive film formation step for forming a conductive film on the stepped insulating film, and an etching step for defining the first and second gate portions. The stepped insulating film includes two parts having first and second thicknesses respectively corresponding to the thicknesses of the first and second gate insulating films. Accordingly, the first and second gate insulating film can be formed once, and conductive film can also be formed once for all the transistors, resulting in simplification of the manufacturing process.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS

Figure 1:
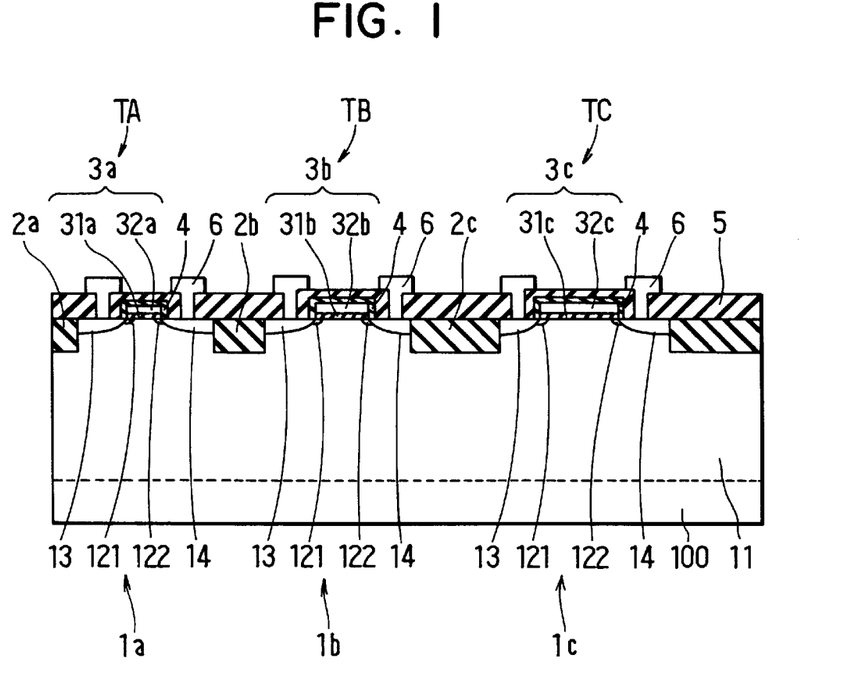
FIG. 1 is a cross-sectional view showing a semiconductor device in a preferred embodiment according to the present invention.

Referring to FIG. 1, a semiconductor device in a preferred embodiment has MOS type transistors TA, TB, TC. The transistors TA, TB, TC have basically the same structure. Specifically, a well 11 is formed in a silicon substrate 100, and transistor regions 1a, 1b, 1c are defined by element isolation oxide films 2a, 2b, 2c. A source 13 and a drain 14 are formed in each transistor region, and electric field relaxation layers 121, 122 having impurity concentrations lower than those of the source 13 and the drain 14 are formed at the ends of the source 13 and the drain 14, respectively, thereby forming an LDD structure. Impurities are implanted into a surface portion of the silicon substrate 100 to control threshold voltages.

Gate portions 3a, 3b, 3c are formed respectively between the sources 13 and the drains 14 on the surface of the silicon substrate 100 to have a stripe-like shape elongating in a direction approximately perpendicular to a paper space of FIG. 1. The gate portions 3a–3c are composed of gate oxide films 31a–31c and polysilicon gate electrodes 32a–32c laminated with the gate oxide films 31a–31c, respectively, and control currents flowing in channels formed between the corresponding sources 13 and the drains 14. Spacers 4 made of an oxide film are provided on side faces of the gate portions 3a–3c. An intermediate film 5 is formed to cover the silicon substrate 100 on which the element isolation oxide films 2a–2c and the gate portions 3a–3c are formed. The sources 13 and the drains 14 electrically communicate with a wiring pattern 6.

The transistors TA-TC have different current-voltage specifications, and therefore voltages (operating voltages) applied across the sources 13 and the drains 14 and to the gate portions 3a–3c of the transistors TA-TC are different from one another. The operating voltage of the transistor TC is the highest of all, and the operating voltage of the transistor TB is higher than that of the transistor TA. Herebelow, the transistors are referred to as a low-voltage transistor TA, an intermediate-voltage transistor TB, and a high-voltage transistor TC.

All the transistors TA-TC have the same concentration profiles of the well 11, the sources, 13, and the drains 14. The concentration and the junction depth of the well 11 determine pn junction withstand voltages between the well 11, and the sources 13 and the drains 14. This withstand voltages are set to exceed the operating voltages of the transistors TATC. For example, a typical operating voltage of a transistor having a gate length of 0.25 μm is 2.5V. When 5V is applied to the transistor, the transistor do not work due to shortage of the withstand voltage. To operate the transistor at 5V, it is necessary to change the concentration of the well to provide the pn junction withstand voltage of 5V or more.

Figure 2:
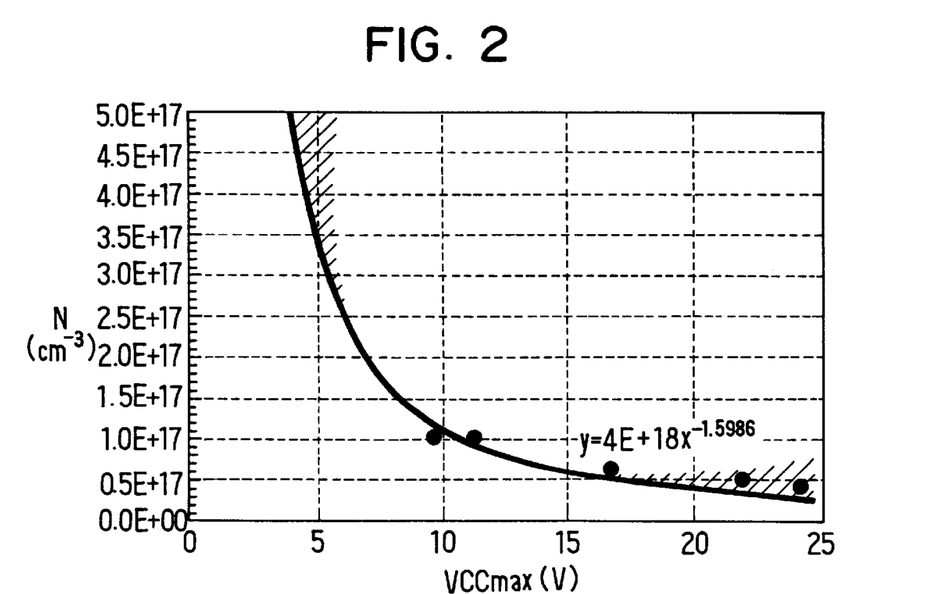
FIG. 2 is a graph for explaining a feature of the semiconductor device.

Under this necessity, a result shown in FIG. 2 is obtained in the present invention. The result indicates a relation between the operating voltage and the well concentration at the junction bottom portion of sources 13 and the drains 14 when the withstand voltage is equal to the operating voltage, i.e., when the operating voltage corresponds to a breakdown voltage. The well concentration monotonously decreases as the operating voltage increases. This tendency is similar to results of various calculation calculated based on simple models. This tendency is extrapolated as a function including the power with respect to the operating voltage, and is thereby expressed by the following formula (1):

$$N = 4 \times 10^{18} \times (Vcc)^{-1.6} [cm^{-3}] \quad (1)$$

where vcc represents the operating voltage [V] and N represents the well concentration [$cm^{-3}$].

When operating voltage Vcc is the operating voltage of the high-voltage transistor TC, which is the highest of all in the transistors TA-TC, the well concentration obtained by the formula (1) satisfies not only the withstand voltage of the high-voltage transistor TC but also those of the transistors TA, TC having operating voltages lower than that of the high-voltage transistor TC. Accordingly, the well concentration is set at $4 \times 10^{18} \times (Vcc_{max})^{-1.6} [cm^{-3}]$ or less.

Impurity implantation amounts for controlling threshold voltages are controlled to be equal to one another in all the transistors TA-TC. Each threshold voltage of the transistors TA-TC is controlled by the thickness of the respective gate oxide film as described below.

Next, a gate length is explained. The gate length is lengthened as the operating voltage is increased, i.e., in order of the high-voltage transistor TC, the middle-voltage transistor TB, and the low-voltage transistor TA. It is advisable to set each gate length to avoid a short channel effect. In the semiconductor device of the present embodiment, because the well concentration is set low for satisfying the high-voltage transistor TC, the short channel is more problematic for the middle-voltage transistor TB and the low-voltage transistor TA in which the gate lengths are shorter than that of the high-voltage transistor TC.

In addition to the well structure described above, in the present embodiment, the following formula (2) is further found to determine the minimum gate length for the respective transistors TA-TC.

$$L_{min} = [2.106 \times 10^{-12} \times \{0.025 \times \ln(0.4765 \times N) + Vcc\}/(1.602 \times 10^{-19} \times N)]^{1/2} + [2.106 \times 10^{-12} \times \{0.025 \times \ln(0.4765 \times N) + (2 \times Vcc)\}/(1.602 \times 10^{-19} \times N)]^{1/2} [cm] \quad (2)$$

where $L_{min}$ represents the gate length, N represents the concentration [$cm^{-3}$] of the well 11 (well concentration) at the junction bottom portions of the sources 13 and the drains 14, Vcc is the operating voltage [V] of each of the transistor TA, TB, or TC. In the transistors TA-TC, the gate length is set to be long as the operating voltage of the transistor becomes large, and to be longer than gate length $L_{min}$ calculated by the formula (2).

The well concentration is sufficiently small as compared to those of the sources and the drains. Therefore, width W of a one-side depletion layer can be expressed by the following formula (3) in the case of a pn step-junction:

$$W = \{2\epsilon_{(si)} \times (V_{bi} + E)/(qN)\}^{1/2} \quad (3)$$

where $\epsilon_{(si)}$ is a dielectric constant of silicon, $V_{bi}$ is a built-in potential peculiar to the junction, E is an applied voltage, and q is a quantum of electricity.

When the one-side depletion layer extends most widely, i.e., when applied voltage E is maximum, the source side satisfies the following formula (4-1) when a substrate bias is maximum (=operating voltage). Here, the term of the built-in potential is affected by well concentration N, concentration $N_{SD}$ of the sources 13 and the drains 14, and temperature T, and is calculated using $N_{SD} = 1 \times 10^{-12} [cm^{-3}]$ and T=room temperature(approximately 300K).

$$W = [2.106 \times 10^{-12} \times \{0.025 \times \ln(0.4765 \times N) + Vcc\}/(1.602 \times 10^{-19} \times N)]^{1/2} [cm] \quad (4-1)$$

On the other hand, the drain side satisfies the following formula (4-2) when the substrate bias is maximum (=operating voltage), and the applied voltage to the drains 14 is also maximum (=operating voltage).

$$W = [2.106 \times 10^{-12} \times \{0.025 \times \ln(0.4765 \times N) + (2 \times Vcc)\}/(1.602 \times 10^{-19} \times N)]^{1/2} [cm] \quad (4-2)$$

When the gate length exceeds the sum of widths of the most widely extending one-side depletion layer (formula (2)), the channel region is not occupied by the depletion layer, thereby avoiding the short channel effect. The semiconductor device of the present embodiment has the LDD structure, and therefore the depletion layer extends toward the side of the low concentration region to reduce the depletion layer at the well side. This may require a modification to formula (3); however, in the present embodiment, no problem arises because the gate length is set at a safety side with respect to the short channel effect. When each of the gate portions 3a–3c has the spacer 4 on a side face thereof as in the present embodiment, a current path extends to the position corresponding to the spacer 4 in the silicon substrate 100. Therefore, in this case, the gate length is defined to include the dimension of the spacer 4 in addition to the gate electrode 32a, 32b, or 32c.

Figure 3:
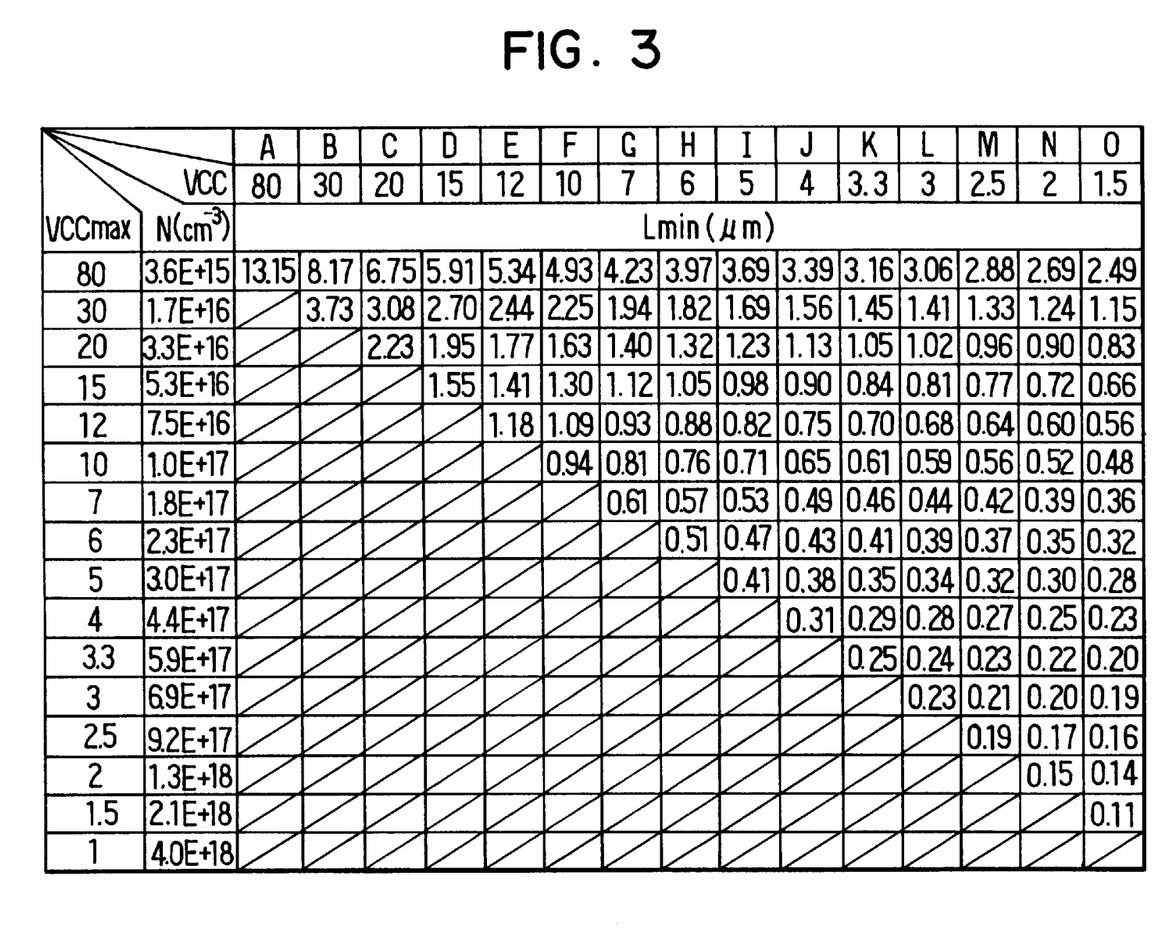
FIG. 3 is a table indicating gate lengths with respect to various operating voltages Vcc which are less than the maximum operating voltage Vcc$_{max}$.

FIG. 3 is a table indicating gate lengths calculated by formula (2) with respect to various operating voltages Vcc which are less than the maximum operating voltage $Vcc_{max}$. Corresponding Well concentrations N are determined to satisfy the formula (1) with respect to the maximum operating voltage $Vcc_{max}$.

For example, when a transistor with an operating voltage of 12V and a transistor with an operating voltage of 5V are disposed together, the well concentration is set at $7.5 \times 10^{16}$ $cm^{-3}$ with respect to the maximum operating voltage 12V, and the gate lengths are set at 1.8 μm or more in the transistor having the operating voltage of 12V, and at 0.82 μm or more in the transistor having the operating voltage of 5V.

Next, the thicknesses of the gate oxide films 31a–31c are explained. The thickness of the gate oxide film is increases as the operating voltage is increased, i.e., in order of the high-voltage transistor TC, the middle-voltage transistor TB, and the low-voltage transistor TA. The thicknesses of the gate oxide films 31a–31c are set in consideration of the life of the semiconductor device as a product.

Figure 4:
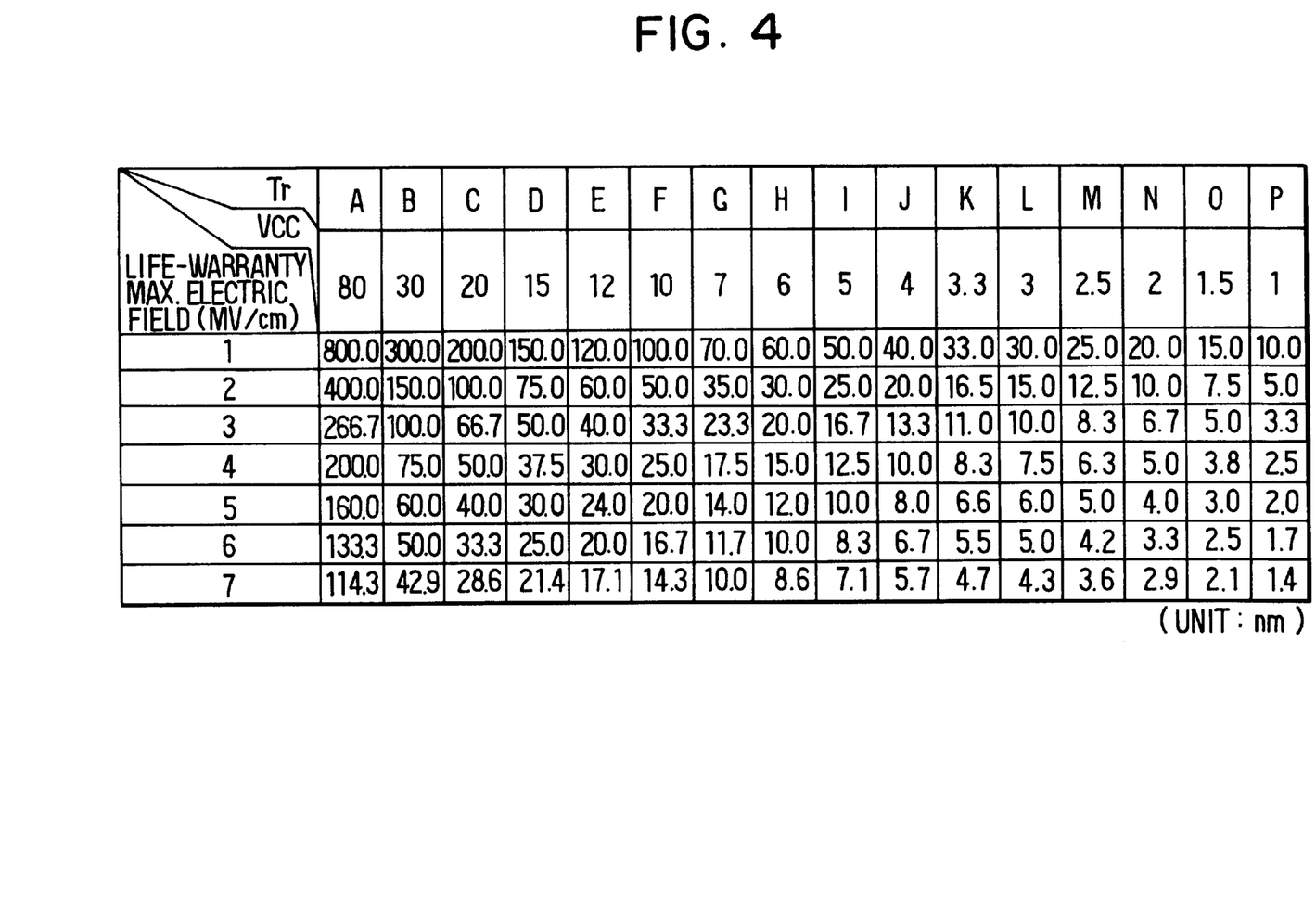
FIG. 4 is a table indicating gate oxide film thicknesses in transistors having different operating voltages.

FIG. 4 is a table indicating gate oxide film thicknesses in respective transistors having different operating voltages. Each of the gate oxide film thicknesses in the table provides the maximum electric field (life-warranty maximum electric field) warranting the life required based on the product life to the gate oxide film. When the thickness of the gate oxide film is determined to be more than that in the table, the required life is warranted. For example, the life-warranty maximum electric field is 2MV/cm, the thickness of the gate oxide film in the transistor having the operating voltage of 12V is set at 60 nm or more. The thickness is in inverse proportion to the life-warranty maximum electric field. In the table, the values of the life-warranty maximum electric field are represented at a MV/cm order as data; however, the range of the life-warranty maximum electric field varies according to the kinds of the insulating film (oxide film, nitride film, and the like) and the fabricating method (thermal oxidation, CVD, and the like).

The widths of the element isolation oxide films 2a–2c are increased as the operating voltage is increased, i.e., in order of the high-voltage transistor TC, the middle-voltage transistor TB, and the low-voltage transistor TA.

An operation of the semiconductor device in the present embodiment will be explained. The specific operating voltages are applied to the sources 13, the drains 14, and the gate electrodes 32a–32c. The applications of the voltages to the gate electrodes 32a–32c induce formations of channels between the sources 13 and the drains 14 in the silicon substrate 100. An electric field in a channel produced by the operating voltage becomes small as the length of the gate portion becomes long, and is in inverse proportion to the thickness of the gate oxide film.

Because the length of the gate portion and the thickness of the gate oxide film are increased as the operating voltage is increased, in the transistor TC having a high operating voltage, the electric field of the channel is relaxed, resulting in high resistance with respect to hot carriers in accordance with the gate length (i.e., channel length). In addition, the gate oxide film has high resistance to deterioration in accordance with the thicknesses of the gate oxide films 31a–31c.

On the other hand, the transistor TB having an intermediate operating voltage has a structure finer than that of the high-voltage transistor TC, and the transistor TA having the lowest operating voltage is a structure finer than those of the intermediate-voltage transistor TB and the high-voltage transistor TC. The operating voltages of the transistors TA, TB are lower than that of the transistor TC. Therefore, even when the lengths of the gate portions 3a, 3b for substantially defining the transistor shapes are set small, the resistances are not largely decreased. The size of the transistors can be finely reduced in accordance with required resistances.

The width of the element isolation oxide film is increased as the operating voltage becomes large, i.e., in order of the high-voltage transistor TC, the middle-voltage transistor TB, and the low-voltage transistor TA. Therefore, the high-voltage transistor TC in which large electric field is produced across the element isolation oxide film 2c by its high operating voltage can exhibit a high element isolation withstand voltage. On the other hand, the transistors TB, TC having lower operating voltages and relatively small electric fields of the element isolation oxide films 2b, 2c can have fine structures corresponding to required element isolation withstand voltages which are determined based on the operating voltages.

The concentration and the junction depth of the well 11 determine the pn junction withstand voltage, and further determine the resistance to hot carriers in cooperation with the lengths of the gate portions 3a–3c. In the present embodiment, the well 11 is formed to provide the pn junction withstand voltage and the like which are required to the high-voltage transistor TC which has the highest operating voltage. The well 11 which is formed to have the same concentration profile in all the transistors TA-TC provides the following effects. That is, when the well is separately formed in each transistor as a conventional example, boundaries having widths of 1 $\mu$m to 2 $\mu$m must be provided between adjacent two wells to avoid interference between impurity concentration profiles of the wells. However, according to the present embodiment, because the well 11 is common to the transistors TA-TC, it is not necessary to provide such boundaries.

In addition, the sources 13, the drains 14, and the well 11 are identical in the transistors TA-TC, resulting in simple structure. These impurity regions are simultaneously formed in all the transistors TA-TC. Therefore, a heat history of a silicon wafer for forming the silicon substrate 100, which is produced in a wafer process, is simple, resulting in stable transistor characteristics. Thus, the transistors TA-TC can have resistances corresponding to the respective operating voltages without impairing those finenesses thereof. The wafer process for forming the transistors is easily and speedily performed at a high yield.

The preferable concentration profile of the well 11 has a shape including a low-concentration impurity region in a surface portion of the silicon substrate 100, such as a shape of a retrograde well. Contribution of the well 11 to the threshold voltages of the transistors TA-TC can be lowered by the low-concentration impurity region. Therefore, the threshold voltages can be flexibly fixed from a small value to a large value based on the impurity amount implanted into the surface portion of the silicon substrate 100 and the thicknesses of the gate oxide films 31a–31c with high controllability.

Here, because the concentration and the impurity implantation amount of the well 11 are common in all the transistors TA-TC, the threshold voltages of the transistors TA-TC are respectively controlled by the thicknesses of the gate oxide films 31a–31c. Otherwise, when the thicknesses of the gate oxide films 31a–31c are determined in consideration of the life of the gate oxide films 31a–31c under the respective operating voltages, required circuit functions can be obtained in consideration of the threshold voltages represented by the following formula (5).

$$VT = A + B \cdot Tox \tag{5}$$

where VT is the threshold voltage, Tox is the thickness of the gate oxide film 31a, 31b, or 31c, and A, B are constants. The approximate formula for threshold voltage VT is not limited to the formula (5).

The present invention can be applied to other types of transistors such as a transistor without having an LDD structure a transistor having a channel stopper layer. Impurity regions for forming these structures can be formed to be the same in all transistors as well as the sources, the drains, and the well to simplify the constitution. The concentration is determined to comply with the highest withstand voltage requirement.

The well 11 can have a relatively high impurity concentration to provide a pn junction withstand voltage at a junction depth (for example, at a 0.2 $\mu$m depth from the surface) with the sources 13 and the drains 14, and have simultaneously high-concentration regions at the bottom portions of the element isolation oxide films 2a–2c. The high-concentration regions increase the threshold voltages at the bottom portions of the element isolation oxide films 2a–2c of the silicon substrate 100. Accordingly, sufficient element isolation withstand voltages can be provided without a channel stopper layer. As a result, the widths of the element isolation oxide films 2a–2c can be further narrowed, resulting in size reduction of the semiconductor device. The concentration of the high-concentration regions is determined to satisfy the element isolation withstand voltage of the high-voltage transistor. The sources 13 and the drains 14 have the same concentration profiles in all the transistors TA-TC; however, they may have different concentration profiles in the respective transistors TA-TC.

When the semiconductor device has nMOS and pMos transistors, it is necessary to form wells having different conductive types. In this case, one of the wells is formed in common to all the nMOS transistors, and another one of the wells is formed in common to all the pMOS transistors. Further, an impurity layer for controlling the threshold voltage is formed in a surface portion of the silicon substrate 100 in common to all the nMOS transistors, and another impurity layer for controlling the threshold voltage is formed in another surface portion of the silicon substrate 100 in common to all the pMOS transistors.

Next, a method for manufacturing the semiconductor device will be explained referring to FIGS. 5A to 5L. In the explanation, the transistors are nMOS.

Figure 5A:
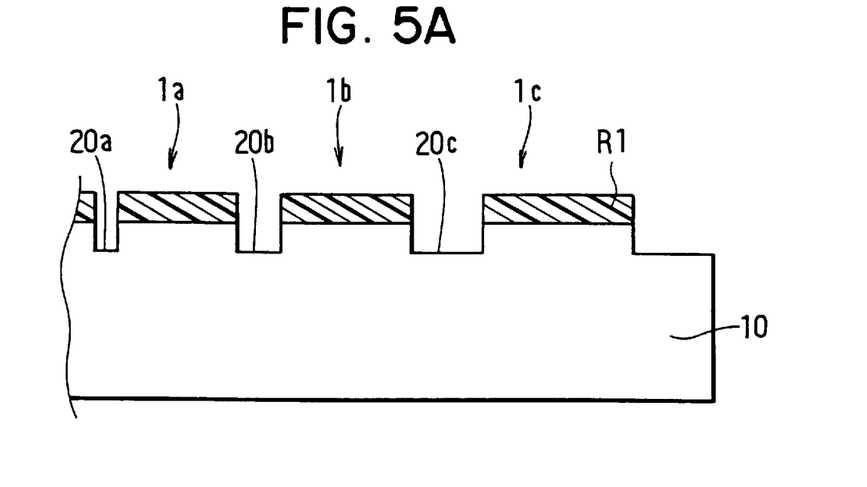
FIGS. 5A to 5L are cross-sectional views for explaining a method for manufacturing the semiconductor device shown in FIG. 1 in a stepwise manner.

The surface of the silicon wafer 10 for forming the silicon substrate 100 is divided into a low-voltage transistor region 1a for forming the low-voltage transistor TA at a right side in FIG. 1, an intermediate-voltage transistor region 1b for forming the intermediate-voltage transistor TB at a middle of the figure, and a high-voltage transistor region 1c for forming the high-voltage transistor TC at a left side of the figure. As shown in FIG. 5A, a photo-resist pattern R1 is formed on the silicon wafer 10 by photo-lithography to have holes at positions where the element isolation oxide films 2a, 2b, 2c are to be formed. The hole at the source side of the high-voltage transistor region 1c is the widest, and the hole at the source side of the low-voltage transistor region 1a is narrowest. Next, recesses 20a, 20b, 20c are formed with a depth of 0.2 $\mu$m to 10.0 $\mu$m by plasma-etching using the photo-resist pattern R1 as a mask.

Figure 5B:
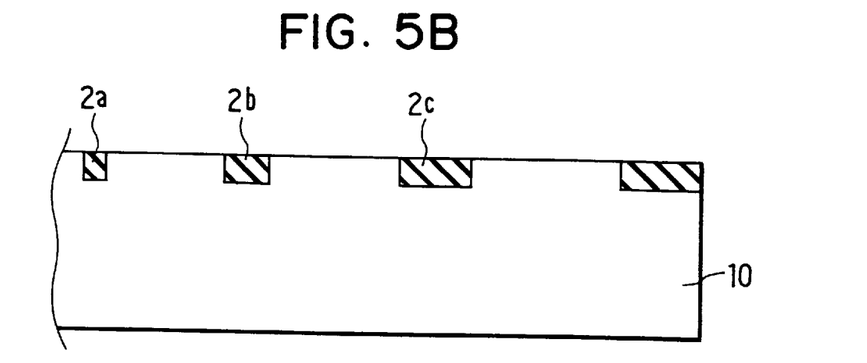

After an oxide film such as TEOS is deposited with a thickness larger than the depth of the recesses 20a–20c, the deposited oxide film is flattened by CMP or the like. Then, as shown in FIG. 5B, etch-back is carried out on the entire surface so that the oxide film except portions filling the recesses 20a–20c is removed. The oxide film portions remaining in the recesses 20a–20c become the element isolation oxide films 2a–2c. The widths of the element isolation oxide films 2a–2c corresponds to the dimensions of the holes of the photo-resist pattern R1. That is, the width of the element isolation oxide film 2c of the high-voltage transistor TC is the largest, and the width of the element isolation oxide film 2a of the low-voltage transistor TA is the smallest. In the present embodiment, since STI is utilized as an element isolation technique, the element isolation oxide films 2a–2c can deeply formed without having bird-beaks. If the depths of the element isolation oxide films 2a–2c are sufficient, the widths of the element isolation oxide films 2a–2c can be made equal to one another.

Next, a protective oxide film is formed on the silicon wafer 10 for protecting the transistor formation surface. The protective oxide film may be formed by the etch-back, by remaining the oxide film with a specific thickness. The protective oxide film is removed when the gate oxide films 31a–31c are formed later. The element isolation oxide films 2a–2c are formed by STI in the present embodiment; however, they may be formed by LOCOS. In this case, it is advisable that the thickness of the element isolation oxide films 2a–2c are set to be equal to each other in all the transistor regions 1a–1c.

Figure 5C:
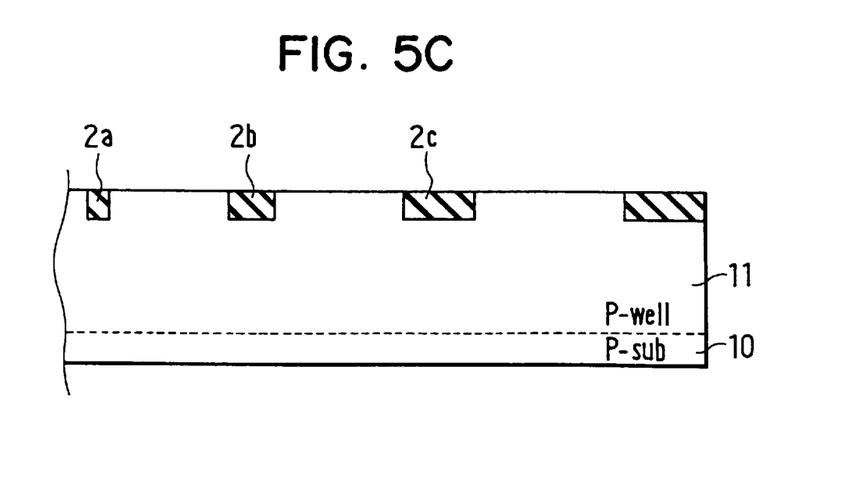

As shown in FIG. 5C, ion-implantation of impurities and drive-in by heat treatment are carried out to form the p type well 11. Because the well 11 is not separately formed for the respective transistor regions, the formation of the well 11 is performed only once, resulting in simplified process. Further, because the well 11 is formed after the element isolation oxide films 2a–2c are formed, impurities implanted into the well 11 are not additionally diffused by heat history. The well 11 can easily have a required impurity concentration profile. The ion implantation is carried out so that the impurity concentration becomes large at the junction depth (for example, 0.2 $\mu$m) of the sources 13 and the drains 14 to secure the withstand voltage at the junctions between the well 11 and the sources 13 and between the well 11 and the drains 14. It is desirable that a highly accelerated ion implantation technique for accelerating ions at 400 KeV or more is used in the ion implantation described above. This technique makes it possible to implant impurities into a deep depth, and accordingly, the retrograde well structure can be easily formed. Here, it should be noted that, in the case where the well 11 is formed after the element isolation oxide films 2a–2c are formed as in the present embodiment, impurities must be implanted through the element isolation oxide films 2a–2c.

The profile of the well 11 in the depth direction is appropriately controlled by performing the ion implantation several times with different acceleration voltages. The drivein following the ion implantation is preferably carried out at a low temperature for a short time period to maintain the impurity concentration distribution. For example, the drive-in is carried out at 1000° C. for 1 hour.

Next, the gate portions 3a to 3c are formed so that the thickness of the gate oxide film is thickened as the operating voltage is increased, i.e., in order of the high-voltage transistor region 1c, the middle-voltage transistor region 1b, and the low-voltage transistor region 1a. The formation of the gate portions 3a–3c is basically performed in procedure of formation of the gate oxide films 31a–31c, deposition of polysilicon, photo-lithography, and etching. When the gate portions are formed separately for each kind of the transistors as a prior art, the process is complicated. Therefore, the present embodiment adopts the following manner.

Figure 5D:
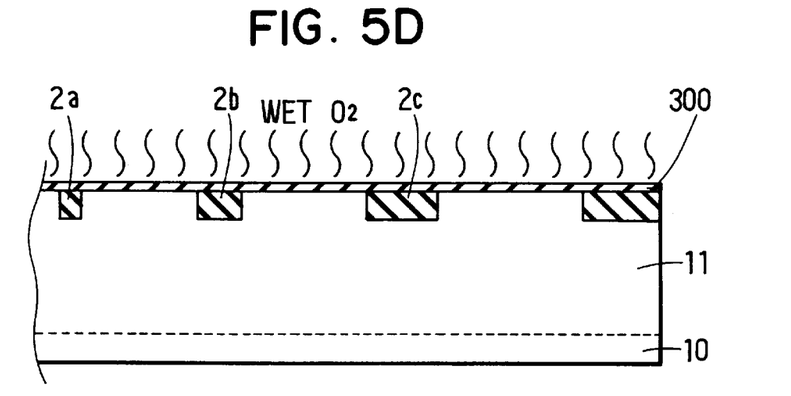
Figure 5E:
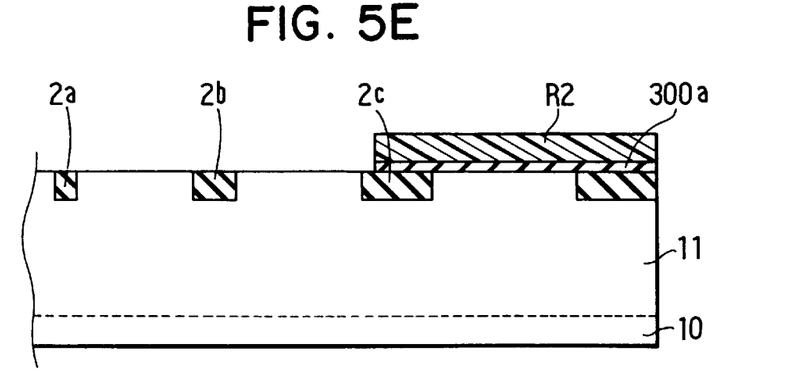

First, at a stepped oxide film formation step, an insulating film with steps is formed so that it has three different thicknesses at the high-voltage transistor region 1c, the middle-voltage transistor region 1b, and the low-voltage transistor region 1a. The stepped oxide film formation step includes an oxide film formation step and a pattern transfer step. First, as shown in FIG. 5D, at the oxide film formation step, an oxide film 300 is formed entirely by thermal oxidation. Next, a photo-resist pattern R2 is formed on the high-voltage transistor region 1c by photo-lithography. Then, at the pattern transfer step, as shown in FIG. 5E, a part of the oxide film 300 formed on the middle-voltage transistor region 1b and the low-voltage transistor region 1a is removed using the photo-resist pattern R2 as a mask. Accordingly, the oxide film 300a is disposed on the high-voltage transistor region 1c.

Figure 5F:
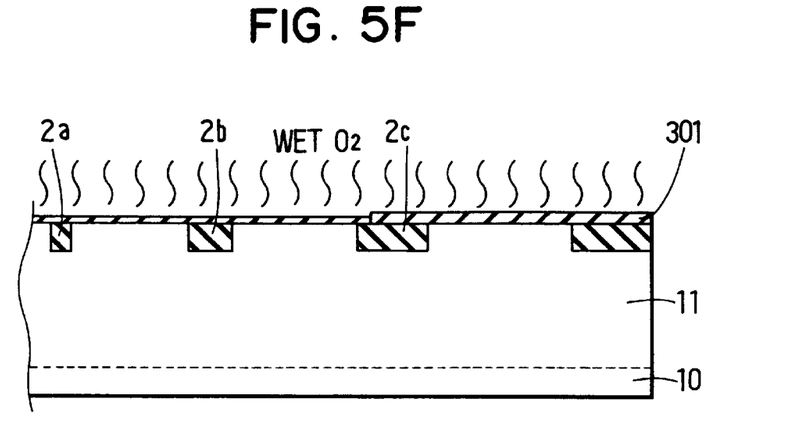
Figure 5G:
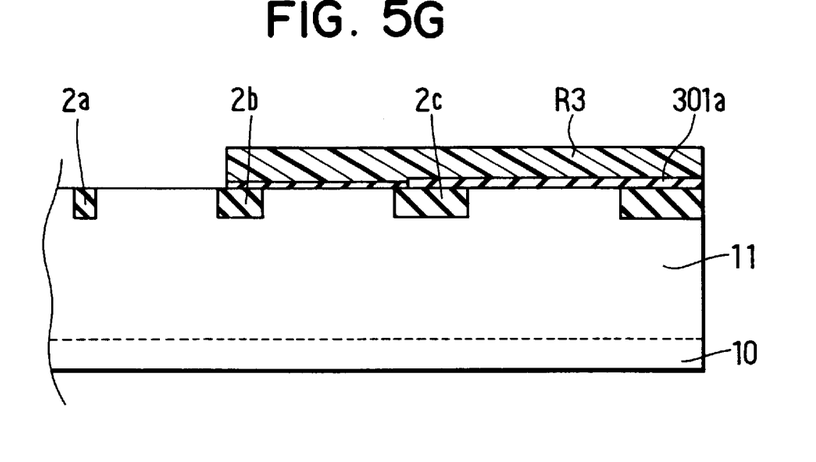

Next, a second stepped oxide film formation step is carried out. After the photo-resist pattern R2 is removed, as shown in FIG. 5F, an oxide film 301 is entirely formed by thermal oxidation (oxide film formation step). The oxide film 301 is thickened at the high-voltage transistor region 1c by the thickness of the oxide film 300a left at the pattern transfer step. Then, a photo-resist pattern R3 is formed on the high-voltage transistor region 1c holding the oxide film 300a thereon and the middle-voltage transistor region 1b by photo-lithography. Using the photo-resist pattern R3 as a mask, as shown in FIG. 5G, the oxide film formed on the low-voltage transistor region 1a is removed (pattern transfer step). Thus, the oxide film 301a remains only on the high-voltage transistor region 1c and on the middle-voltage transistor region 1b.

Figure 5H:
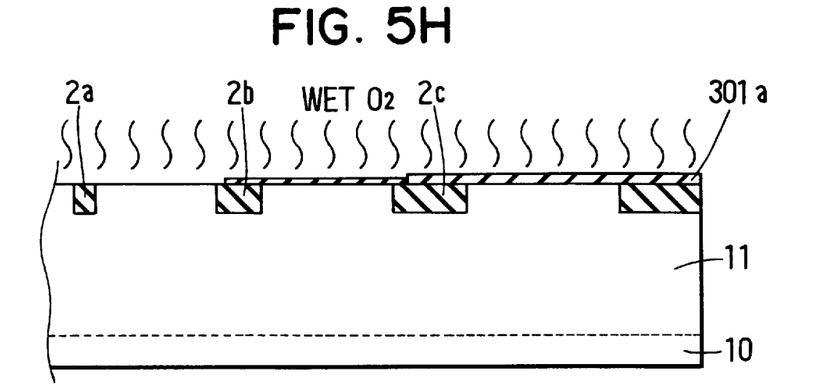
Figure 5I:
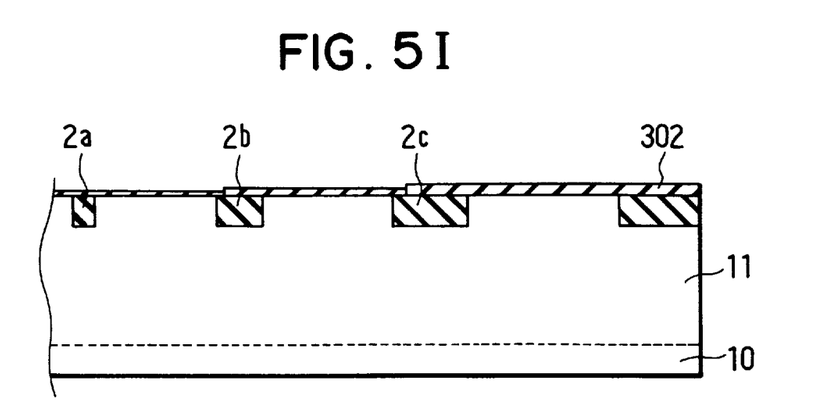

After the photo-resist pattern R3 is removed, as shown in FIG. 5H, thermal oxidation is performed again (oxide film formation step), so that another oxide film 302 is entirely formed as shown in FIG. 5I. The oxide film 302 is thickened at the high-voltage transistor region 1c as compared to that at the low-voltage transistor region 1a by the oxide films formed at the two oxide film formation steps as described above. The oxide film 302 is thickened at the middle-voltage transistor region 1b as compared to that at the low-voltage transistor region 1a by the oxide film formed at the one oxide film formation step. Consequently, the stepped oxide film 302 is formed. The thicknesses of the oxide film 302 at the transistor regions 1a–1c can be arbitrarily controlled by controlling the three oxide film formation steps. The thicknesses are controlled in consideration of required threshold voltages.

After the oxide film 302 is formed, impurities are implanted into the surface portion of the silicon substrate 100 by ion implantation to control the threshold voltages. The implantation of impurities is carried out once for all the transistor TA-TC to have approximately the same impurity implantation amount. No mask is used, otherwise, a mask having an opening exposing all positions of the transistors TA-TC is used in the ion implantation. Therefore, even when the mask is used, it is sufficient to perform a photo-lithography step only once to form the mask for the ion implantation by using only one mask for exposure. This results in simplification of the process and low cost.

Figure 5J:
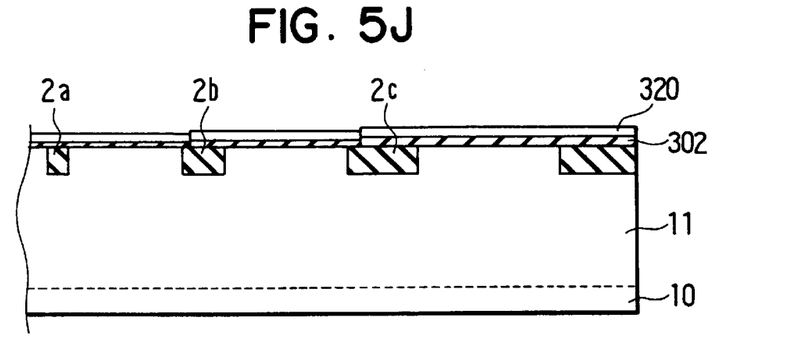
Figure 5K:
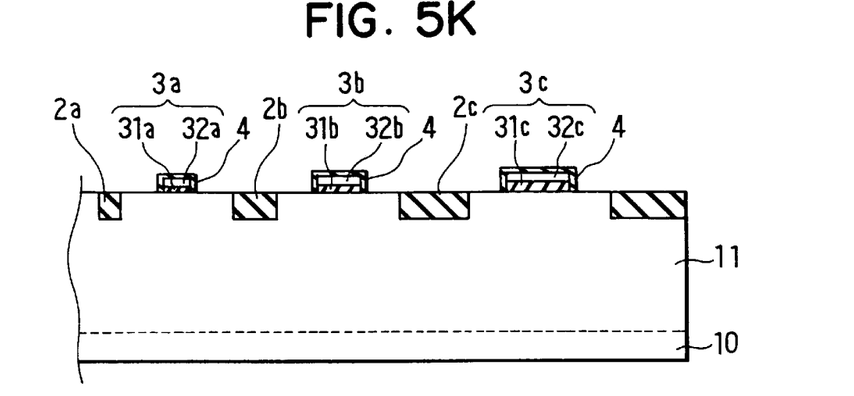

Subsequently, as shown in FIG. 5J, polysilicon is entirely deposited to form a polysilicon film 320 as a conductive film (conductive film formation step). A photo-resist pattern is disposed at positions corresponding to the gate portions 3a–3c by photo-lithography, and then, the polysilicon film 320 and the underlying oxide film 302 where no photo-resist pattern exists thereon is removed by etching, thereby forming the gate portions 3a–3c respectively composed of the gate oxide films 31a–31c and the gate electrodes 32a–32c laminated with one another. Next, as shown in FIG. 5K, the spacers 4 are formed to cover the gate portions 3a–3c elongating from the silicon surface by thermal oxidation performed in an oxygen atmosphere.

When several transistors are formed with different gate oxide films on a silicon wafer, according to a prior art, in each transistor region, each gate portion is formed in procedure of formation of an oxide film, formation of a polysilicon film, photo-lithography, and etching. This method is referred to as a comparative example and is compared with the gate portion formation step according to the present embodiment.

In the comparative example, the formation of the oxide film, the formation of the polysilicon film, photo-lithography, and etching must be performed several times corresponding to the number (N) of the transistors having operating voltages different from one another. As opposed to thin, according to the present invention, the formation of the polysilicon film is performed only once. Therefore, the number of steps is largely decreased. The formation of the oxide film is performed N times. A number of times for performing the photo-lithography and the etching is the sum of the number of times for forming the steps to the oxide film, i.e., (N–1) times, and the number of times for forming the gate portions, i.e., one time. That is, they are performed N times. In the conventional example, all the photo-lithography and the etching performed N times are performed for forming the gate portions, and therefore, they are required to have high processing accuracies. As opposed to this, according to the present invention, the photo-lithography and the etching are performed only once for forming the gate portions, resulting in higher yield than the conventional example.

In the present invention, the photo-lithography and the etching are performed (N–1) times at the pattern transfer steps as described above. The oxide films are removed except the portions for the gate oxide films. Therefore, it is not necessary that the oxide films 301, 302 are processed with high processing accuracies and high overlapping accuracies at the pattern transfer steps. Therefore, the stepped oxide film is easily formed in the present embodiment.

Figure 5L:
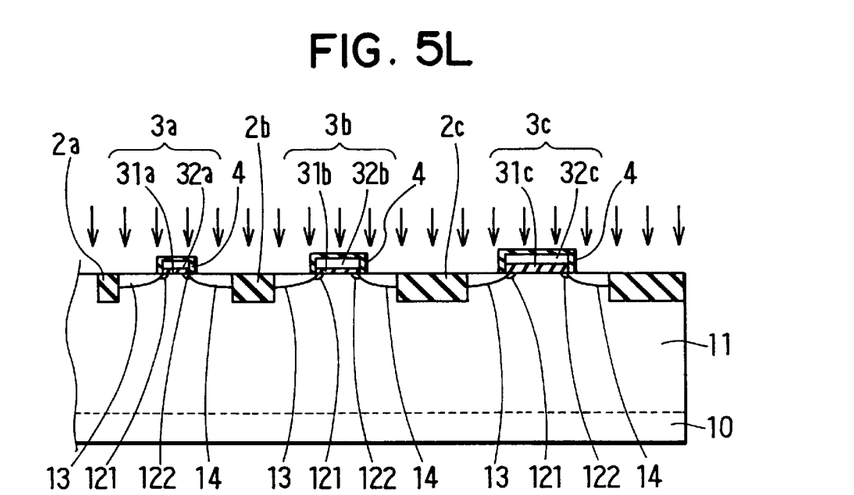

Then, the low concentration impurity region for the electric field relaxation layer is formed by implanting ions such as arsenic (As). Subsequently, as shown in FIG. 5L, the sources 13 and the drains 14 are formed in all the transistor regions 1a–1c by implanting ions such as phosphorus (P). Because it is not necessary to separately form them for the respective transistor regions, the formation of the sources 13 and the drains 14 is performed only once, resulting in simplified process. Further, because the sources 13, the drains 14, and the well 11 are simple to have simple heat histories, those impurity concentration profiles are easily controlled as compared to the case where the sources and the drains are separately formed in the respective transistor regions. Consequently, the wafer process is speedily performed with a high yield.

After forming the basic structure of the transistors, the intermediate film 5 is formed on the silicon wafer 10 on which the gate portions 3a–3c and the spacers 4 are formed, and the wiring pattern 6 is formed to communicate with the sources 13 and the drains 14 of the respective transistors TA-TC. Thus, the semiconductor device shown in FIG. 1 is completed.

In the present embodiment, three operating voltages indicated as high, middle, and low voltages are used; however, the operating voltages are not limited to those. The present invention can be applied to a semiconductor device holding several transistors using two or more than three kinds of operating voltages.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor device comprising:
   a semiconductor substrate;
   a well provided in the semiconductor substrate;
   an element isolation insulating film dividing the well into first and second transistor regions;
   a first transistor provided at the first transistor region and having a first source, a first drain and a first gate portion composed of a first gate insulating film and a first gate electrode laminated with the first gate insulating film; and
   a second transistor provided at the second transistor region and having a second source, a second drain, and a second gate portion composed of a second gate insulating film and a second gate electrode laminated with the second gate insulating film, wherein:

a first operating voltage for operating the first transistor is larger than a second operating voltage for operating the second transistor;

a gate length of the first gate portion is longer than that of the second gate portion;

a thickness of the first gate insulating film is thicker than that of the second gate insulating film;

the well has an impurity concentration profile approximately identical for the first and second transistors; and an impurity amount implanted into a surface portion of the first transistor region for controlling a threshold voltage of the first transistor is equal to that for controlling a threshold voltage of the second transistor.

2. The semiconductor device of claim 1, wherein the well has a surface region exposed from a surface of the semiconductor substrate and a junction region contacting one of the first and second sources and the first and second drains, the surface region having an impurity concentration lower than that of the junction region.

3. The semiconductor device of claim 2, wherein the well has a high concentration region at a depth approximately corresponding to a bottom of the element insulating film, the high concentration region having an impurity concentration higher than that of the junction region.

4. The semiconductor device of claim 1, wherein the well has a junction region contacting one of the first and second sources and the first and second drains and a high concentration region at a depth approximately corresponding to a bottom of the element insulating film, the high concentration region having an impurity concentration higher than that of the junction region.

5. The semiconductor device of claim 1, wherein the first source and the first drain of the first transistor have concentration profiles approximately identical with those of the second source and the second drain of the second transistor.

6. The semiconductor device of claim 5, wherein the well has a surface region exposed from a surface of the semiconductor substrate and having an impurity concentration lower than that of the well other than the surface region.

7. The semiconductor device of claim 5, wherein the well has a high concentration region at a depth approximately corresponding to a bottom portion of the element isolation insulating film, the high concentration region having an impurity concentration larger than the well other than the high concentration region.

8. The semiconductor device of claim 5, wherein the first and second gate portions of the first and second transistors are formed by;

a stepped insulating film formation step for forming a stepped insulating film on a surface of the semiconductor substrate, the stepped insulating film including two parts having first and second thicknesses respectively corresponding to the thicknesses of the first and second gate insulating films;

a conductive film formation step for forming a conductive film on the stepped insulating film; and an etching step for etching the conductive film and the stepped insulating film to define the first and second gate portions.

9. The semiconductor device of claim 8, wherein the stepped insulating film formation step includes:

forming a first oxide film on the semiconductor substrate by thermal oxidation;

removing the first oxide film other than the first transistor region; and forming a second oxide film on the semiconductor substrate where the first oxide film is removed and on the first oxide film at the first transistor region, thereby forming the stepped insulating film.

10. The semiconductor device of claim 1, wherein the first and second gate portions of the first and second transistors are formed by;

a stepped insulating film formation step for forming a stepped insulating film on a surface of the semiconductor substrate, the stepped insulating film including two parts having first and second thicknesses respectively corresponding to the thicknesses of the first and second gate insulating films;

a conductive film formation step for forming a conductive film on the stepped insulating film; and an etching step for etching the conductive film and the stepped insulating film to define the first and second gate portions.

11. The semiconductor device of claim 10, wherein the stepped insulating film formation step includes:

forming a first oxide film on the semiconductor substrate by thermal oxidation;

removing the oxide film other than the first transistor region; and forming a second oxide film on the semiconductor substrate where the first oxide film is removed and on the first oxide film remaining at the first transistor region, thereby forming the stepped insulating film.

12. The semiconductor device of claim 1, wherein a withstand voltage at a junction between one of the first source and the first drain and the well is equal to or larger than that of the first operating voltage that is larger than the second operating voltage.

13. The semiconductor device of claim 1, wherein:

the well has a junction region contacting one of the first and second drains and the first and second sources; and an impurity concentration of the junction region is equal to or less than $4\times10^{18}\times(Vcc_{max})^{-1.6}$ [cm$^{-3}$] in which $Vcc_{max}$ corresponds to the first operating voltage of the first transistor.

14. The semiconductor device of claim 1, wherein:

the well has a first junction region contacting one of the first drain and the first source, and a second junction region contacting one of the second drain and the second source and having a concentration N [cm$^{-3}$] approximately the same as that of the first junction region; and each gate length of the first and second transistors is larger than $L_{min}$ represented by a formula of:

$$L_{min}=[2.106\times10^{-12}\times\{0.025\times\ln(0.4765\times N)+Vcc\}/(1.602\times10^{-9}\times N)]^{1/2}+[2.106\times10^{-12}\times\{0.025\times\ln(0.4765\times N)+(2\times Vcc)\}/(1.602\times10^{-19}\times N)]^{1/2}[cm],$$

wherein Vcc is a corresponding one of the first and second operating voltages.

15. The semiconductor device of claim 14, wherein:

the semiconductor device has more than two transistors respectively having operating voltages different from one another; and Vcc represents a maximum operating voltage in all the operating voltages.

16. The semiconductor device according to claim 1, wherein an impurity concentration of the well is in a range of $1\times10^{16}$ [cm$^{-3}$] to $5\times10^{17}$ [cm$^{-3}$] inclusive.

* * * * *